(12) United States Patent
Afzali-Ardakani et al.

(10) Patent No.: US 9,972,797 B2
(45) Date of Patent: *May 15, 2018

(54) AMBIPOLAR SYNAPTIC DEVICES

(71) Applicant: International Business Machines Corporation, Armonk, NY (US)

(72) Inventors: Ali Afzali-Ardakani, Ossining, NY (US); Tze-Chiang Chen, Yorktown Heights, NY (US); Kailash Gopalakrishnan, San Jose, CA (US); Bahman Hekmatshoartabari, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/650,874

(22) Filed: Jul. 15, 2017

(65) Prior Publication Data
US 2017/0317304 A1   Nov. 2, 2017

Related U.S. Application Data

(60) Continuation of application No. 15/262,145, filed on Sep. 12, 2016, now Pat. No. 9,735,383, which is a
(Continued)

(51) Int. Cl.
*H01L 29/06* (2006.01)
*H01L 31/00* (2006.01)
(Continued)

(52) U.S. Cl.
CPC ......... *H01L 51/0566* (2013.01); *G06N 3/063* (2013.01); *G06N 3/0635* (2013.01);
(Continued)

(58) Field of Classification Search
None
See application file for complete search history.

(56) References Cited

U.S. PATENT DOCUMENTS 5,457,771 A   10/1995  Imondi et al.
7,652,339 B2  1/2010   Wu
(Continued)

FOREIGN PATENT DOCUMENTS

JP   2010114184   5/2010

OTHER PUBLICATIONS

Kurtis D. Cantleya et al, Spike Timing-Dependent Synaptic Plasticity Using Memristors and Nano-Crystalline Silicon TFT Memories. 2011 11th IEEE International Conference on Nanotechnology Portland Marriott. Aug. 15-18, 2011, Portland, Oregon, USA pp. 421-425.

*Primary Examiner* — Calvin Choi
(74) *Attorney, Agent, or Firm* — Louis J. Percello; Otterstedt, Ellenbogen & Kammer, LLP

(57) ABSTRACT

Device architectures based on trapping and de-trapping holes or electrons and/or recombination of both types of carriers are obtained by carrier trapping either in near-interface deep ambipolar states or in quantum wells/dots, either serving as ambipolar traps in semiconductor layers or in gate dielectric/barrier layers. In either case, the potential barrier for trapping is small and retention is provided by carrier confinement in the deep trap states and/or quantum wells/dots. The device architectures are usable as three terminal or two terminal devices.

12 Claims, 13 Drawing Sheets

Related U.S. Application Data continuation of application No. 14/684,343, filed on Apr. 11, 2015, now Pat. No. 9,472,641, which is a division of application No. 14/181,245, filed on Feb. 14, 2014, now Pat. No. 9,147,615.

(51) Int. Cl.

| | | |
|---|---|---|
| *H01L 51/05* | (2006.01) | |
| *H01L 21/8238* | (2006.01) | |
| *H01L 29/08* | (2006.01) | |
| *H01L 29/165* | (2006.01) | |
| *H01L 29/267* | (2006.01) | |
| *H01L 29/66* | (2006.01) | |
| *H01L 29/778* | (2006.01) | |
| *G06N 3/063* | (2006.01) | |
| *G11C 11/54* | (2006.01) | |
| *H01L 29/12* | (2006.01) | |
| *H01L 29/10* | (2006.01) | |
| *H01L 29/43* | (2006.01) | |
| *H01L 29/51* | (2006.01) | |
| *H01L 51/00* | (2006.01) | |
| *H01L 21/28* | (2006.01) | |
| *H01L 29/423* | (2006.01) | |
| *H01L 29/788* | (2006.01) | |

(52) U.S. Cl.
CPC .......... *G11C 11/54* (2013.01); *H01L 21/8238* (2013.01); *H01L 29/0649* (2013.01); *H01L 29/0843* (2013.01); *H01L 29/0847* (2013.01); *H01L 29/1029* (2013.01); *H01L 29/1054* (2013.01); *H01L 29/122* (2013.01); *H01L 29/125* (2013.01); *H01L 29/127* (2013.01); *H01L 29/165* (2013.01); *H01L 29/267* (2013.01); *H01L 29/432* (2013.01); *H01L 29/51* (2013.01); *H01L 29/66431* (2013.01); *H01L 29/66462* (2013.01); *H01L 29/66477* (2013.01); *H01L 29/7783* (2013.01); *H01L 29/7786* (2013.01); *H01L 51/0541* (2013.01); *H01L 51/0545* (2013.01); *H01L 51/0562* (2013.01); *H01L 21/28273* (2013.01); *H01L 29/0665* (2013.01); *H01L 29/0673* (2013.01); *H01L 29/42324* (2013.01); *H01L 29/7788* (2013.01); *H01L 29/7881* (2013.01); *H01L 51/0055* (2013.01); *H01L 2251/301* (2013.01)

(56) References Cited

U.S. PATENT DOCUMENTS

| | | |
|---|---|---|
| 7,750,339 B2 | 7/2010 | Setayesh |
| 7,960,720 B2 | 6/2011 | Kamikawa |
| 8,148,218 B2 | 4/2012 | Chang |
| 8,274,098 B2 | 9/2012 | Chung |
| 8,384,122 B1 | 2/2013 | Hu et al. |
| 9,147,615 B2 | 8/2015 | Afzali-Ardakani |
| 9,318,572 B2 | 4/2016 | Afzali-Ardakani |
| 9,472,641 B2 | 10/2016 | Afzali-Ardakani |
| 2004/0125629 A1 | 7/2004 | Scheuerlein et al. |
| 2005/0258467 A1 | 11/2005 | Wang et al. |
| 2007/0132043 A1 | 6/2007 | Bradley et al. |
| 2008/0157128 A1 | 7/2008 | Katz et al. |
| 2009/0108304 A1 | 4/2009 | Ng et al. |
| 2009/0207656 A1 | 8/2009 | Kuo et al. |
| 2010/0163847 A1 | 7/2010 | Majhi et al. |
| 2011/0180907 A1 | 7/2011 | McConnell |
| 2011/0215314 A1 | 9/2011 | De Leeuw |
| 2012/0018706 A1 | 1/2012 | Kagan et al. |
| 2012/0175602 A1 | 7/2012 | Hwang |
| 2013/0105765 A1 | 5/2013 | Haensch et al. |
| 2014/0067743 A1 | 3/2014 | Park et al. |
| 2015/0235123 A1 | 8/2015 | Afzail-Ardakani |
| 2015/0236283 A1 | 8/2015 | Afzail-Ardakani |
| 2015/0236285 A1 | 8/2015 | Afzail-Ardakani |
| 2015/0380517 A1 | 12/2015 | Afzali-Ardakani |
| 2017/0005281 A1 | 1/2017 | Afzali-Ardakani |

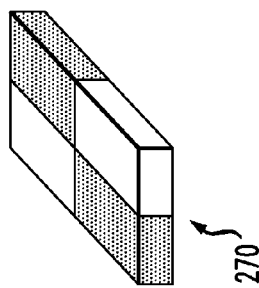
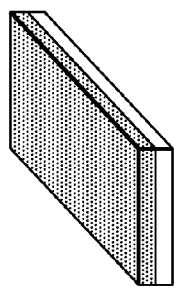
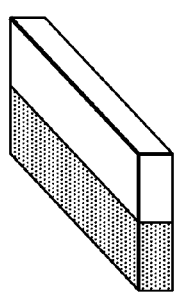
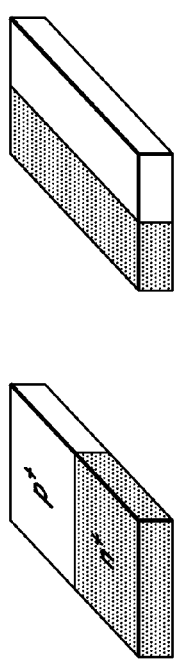
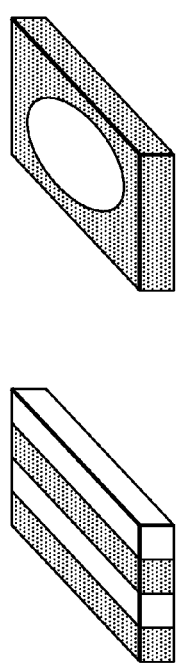
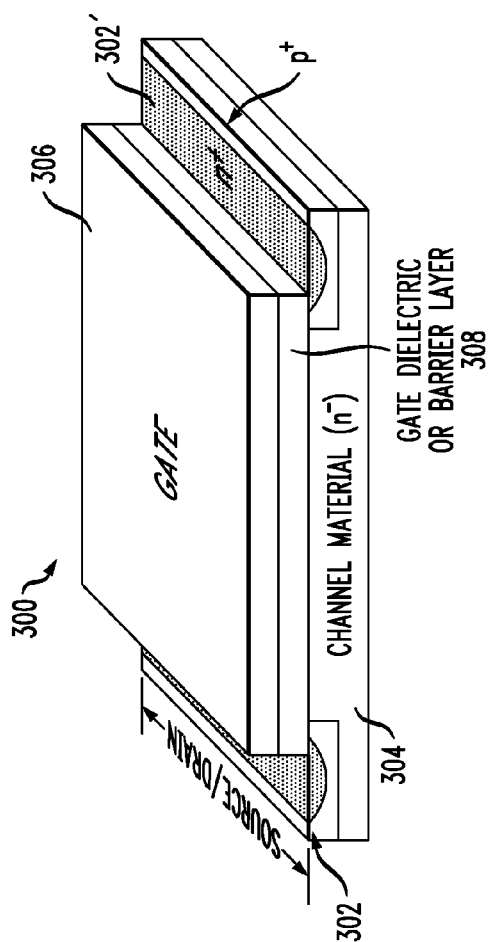
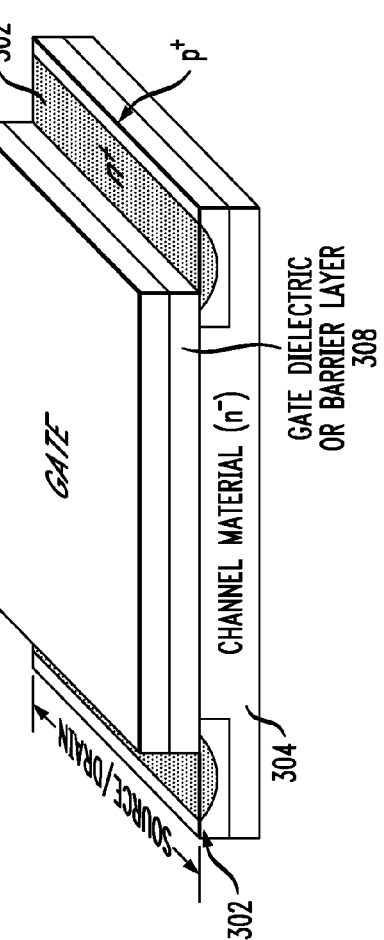
FIG. 14A  FIG. 14B  FIG. 14C  FIG. 14D
FIG. 14E  FIG. 14F
FIG. 15

AMBIPOLAR SYNAPTIC DEVICES

CROSS REFERENCE TO RELATED APPLICATION

This application is a continuation of U.S. patent application Ser. No. 15/262,145 filed Sep. 12, 2016, which is a continuation of U.S. patent application Ser. No. 14/684,343 filed Apr. 11, 2015, now U.S. Pat. No. 9,472,641 which is a division of U.S. patent application Ser. No. 14/181,245 filed Feb. 14, 2014, now U.S. Pat. No. 9,147,615, the complete disclosures of which are expressly incorporated herein by reference in their entireties for all purposes.

FIELD

The present disclosure relates to the physical sciences, and, more particularly, to devices for trapping and de-trapping holes and electrons, methods of employing such devices, and methods of fabrication thereof.

BACKGROUND

Most present implementations of synaptic function are based on multiple devices in CMOS (complementary metal oxide semiconductor) platform. The area taken by the large number of such devices is one of the limitations on these implementations for neuromorphic computing. Single devices based on charge trapping in architectures similar to flash memory have also been used to implement synaptic devices. Electrons are stored in an insulator using CTF (charge trap flash) technology. Device architectures based on charge trapping, such as flash memories, may be used to implement synaptic devices. However, the voltage and/or current required for operation is generally too high for some applications such as neuromorphic computing. This problem arises due to the energy required for electrons to tunnel over a barrier before becoming trapped in, for example, a floating gate. Such a barrier is needed to provide sufficient retention time.

SUMMARY

Principles of the present disclosure provide an ambipolar synaptic device including a semiconductor layer, a gate operatively associated with the semiconductor layer, a first structure configured for injecting both electrons and holes into the semiconductor layer, and a second structure configured for trapping, de-trapping and/or recombination of both electrons and holes injected by the first structure into the semiconductor layer.

A method provided in accordance with the principles described herein includes providing a synaptic device including a first structure for injecting both electrons and holes into a semiconductor layer and traps for trapping both electrons and holes and receiving an electrical signal at the synaptic device, thereby causing the first structure to inject one of electrons and holes into the semiconductor layer. The method further includes effecting net negative charge trapping or net positive charge trapping within the traps upon injection of the one of electrons and holes into the semiconductor layer.

A further method includes obtaining a substrate including a first semiconductor layer and first and second electrically insulating layers, the semiconductor layer being between the first and second electrically insulating layers, removing a portion of the first semiconductor layer, thereby forming a space between the first and second electrically insulating layers, growing a channel layer containing quantum structures in the space such that the quantum structures are functional as ambipolar traps, and forming a source/drain structure including p+ and n+ regions adjoining the channel layer and configured to inject both electrons and holes into the channel layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Ambipolar synaptic structures and fabrication methods as disclosed herein can provide substantial beneficial technical effects. For example, one or more embodiments may provide one or more of the following advantages:
   Relatively small potential barrier for trapping;
   Choice of device architectures;
   Applicability to neuromorphic computing;
   Relatively low operation voltages
   Providing relatively high drive currents
   These and other features and advantages will become apparent from the following detailed description of illustrative embodiments thereof, which is to be read in connection with the accompanying drawings.

BRIEF DESCRIPTION OF THE DRAWINGS

FIGS. 14A-F are schematic illustrations of exemplary source/drain regions that may be employed in ambipolar synaptic devices;

FIG. 15 is a schematic illustration of an ambipolar synaptic device wherein the source/drain regions include regions of a first doping type confined within regions of a second doping type;

DETAILED DESCRIPTION

Devices and methods based on trapping and de-trapping and/or recombination of electrons and holes, as opposed to only one type of carrier, are disclosed in further detail below. In some embodiments, this is achieved by carrier trapping in near-interface deep (i.e. near mid-gap) ambipolar states in a semiconductor layer or a gate dielectric layer. In other embodiments, quantum wells or dots in a semiconductor layer or a gate dielectric layer function as ambipolar traps. In either embodiment type, the potential barrier for trapping is small. Carrier retention is provided by carrier confinement in the deep trap states or quantum wells. Single dense devices that can represent the function of a synapse at low operation power are provided in accordance with one or more embodiments. Such devices can be applied to advantage within neuromorphic computing systems. Three terminal devices and two terminal devices employing such technology are feasible.

Figure 1A:
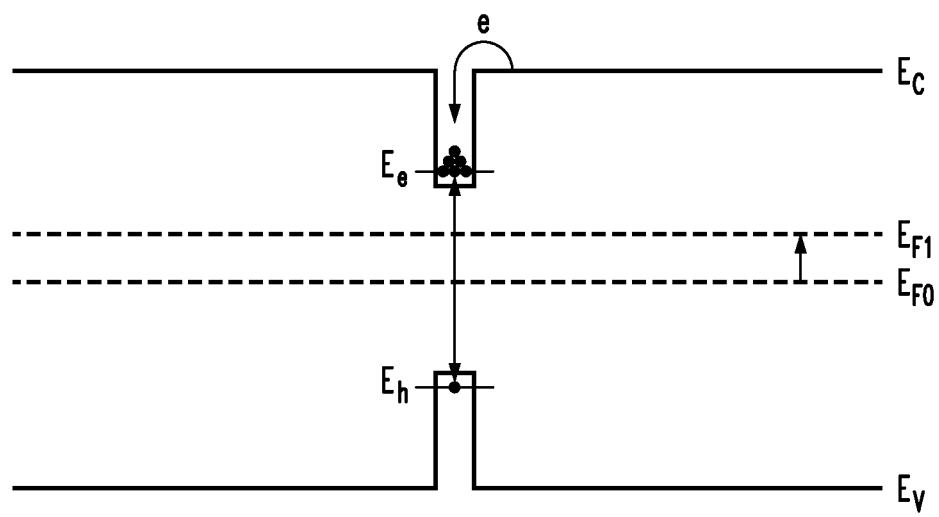
FIGS. 1A and 1B are energy band diagrams showing schematic operation of quantum wells or dots in a channel.
Figure 1B:
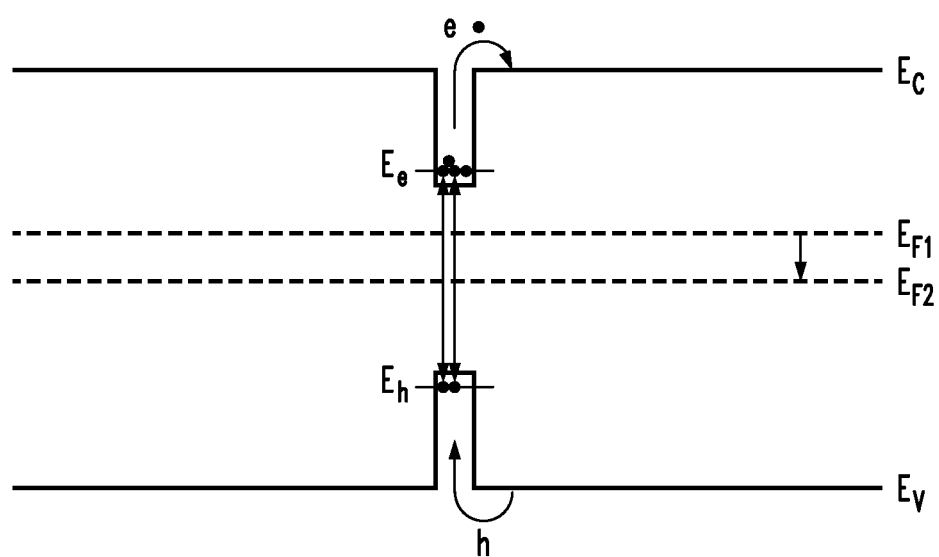

In some exemplary embodiments, ambipolar synaptic devices include quantum wells or quantum dots in the channels thereof. FIGS. 1A and 1B provide schematic illustrations of modes of operation of quantum wells and dots in a channel. Referring to the energy band diagram provided in FIG. 1A, a positive gate bias causes the Fermi energy ($E_F$) in the illustrated bandgap to shift up. Electron trapping is shown at $E_e$, where $E_c$ represents the energy of conduction level. Hole de-trapping at $E_h$, not shown in FIG. 1A, is a further possibility. Recombination of electrons and holes also occurs as illustrated. $E_F$ is stabilized at a higher level (e.g. $E_{F1}$) when the bias is removed. In contrast, a negative bias shifts the Fermi energy $E_F$ down as shown in FIG. 1B. Electron de-trapping at $E_e$ is possible as shown and hole trapping occurs at $E_h$, where $E_v$ represents the energy of valence level. Recombination of electrons and holes is also possible as shown. $E_F$ stabilizes at a lower level when the negative bias is removed. In some embodiments, de-trapping dominates over recombination, while in some other embodiments recombination is dominant. In some embodiments, de-trapping and recombination occur at comparable rates. In the exemplary drawings provided in FIGS. 1A and 1B, the energy levels $E_e$ and $E_h$ are located at the same spatial position. This is the case for example if a quantum dot/well or structural defect provides both electron trapping and hole trapping functions. However, in some embodiments the $E_e$ and $E_h$ levels may be located at different spatial positions, for example provided by two types of quantum dots/wells (e.g. comprised of two different materials) or structural defects (resulting in deep traps) where one type provides electron trapping function and the other type provides hole trapping function. It is possible that the two types of dots/wells or defects are located at the same (or very close) spatial position, thus resulting in $E_e$ and $E_h$ levels similar to that of a single quantum dot or structural defect (i.e. at the same or about the same spatial position) as shown in FIGS. 1A and 1B. It should be noted that, as known in the art, if the quantum dots/wells or defects are substantially close to each other such that their electronic wavefunctions overlap, they result in spatially continuous $E_e$ and $E_h$ levels. In all of the cases described above, the operation of the disclosed devices is principally the same as that described for the exemplary FIGS. 1A and 1B.

Figure 2A:
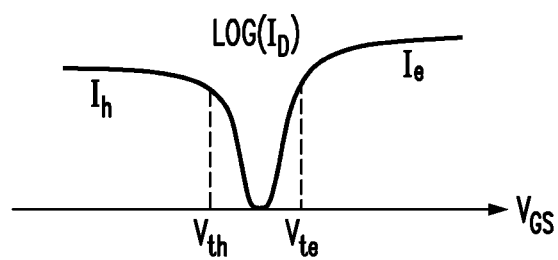
FIGS. 2A and 2B are schematic transfer characteristics showing operation of a three-terminal device including quantum wells or dots in a channel with respect to hole and electron trapping.
Figure 2B:
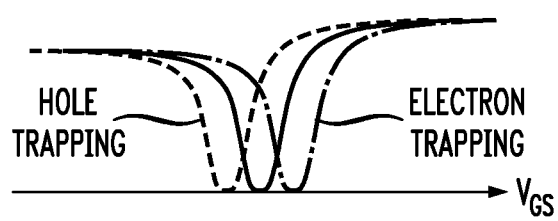
Figure 3A:
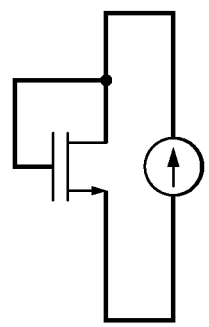
FIGS. 3A and 3B show exemplary schematic circuit diagrams of two terminal devices realized by connecting the gates and drains of three terminal devices, upon the application of positive and negative biases, respectively.
Figure 3B:
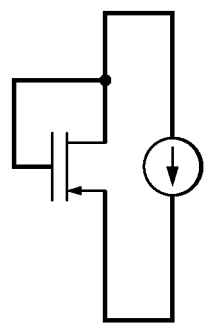

Operation of a three-terminal device having quantum wells/dots or ambipolar deep traps in the channel is illustrated in FIGS. 2A and 2B wherein $V_{GS}$ represents the gate-source voltage of an exemplary transistor device. FIG. 2A shows the transfer characteristics of the device at a given state. At a positive gate voltage, electrons are induced in the channel and effective electron trapping in the quantum well(s), dot(s) or ambipolar traps increases the threshold voltage $V_{th}$ for electrons and reduces the threshold voltage for holes. Therefore, as shown in FIG. 2B, the transfer characteristics of the device shift to the right with respect to that in FIG. 2A. At a negative voltage, holes are induced in the channel and effective hole trapping in the quantum well(s) reduces the threshold voltage for electrons and increases the threshold voltage for holes. Therefore, as shown in FIG. 2B, the transfer characteristics of the device shift to the left with respect to that in FIG. 2A. Note it has been assumed that the transfer characteristics are obtained at sufficiently short measurement times that do not substantially change the state of the device, i.e. the measurement of the transfer characteristics does not program the device by electron and/or hole trapping. Two-terminal operation is schematically illustrated in FIGS. 3A and 3B wherein the gate is electrically connected to the drain. A positive voltage/current (FIG. 3A) creates an n-channel device, shifting the threshold voltage to the right and facilitating electron trapping. Negative voltage/current creates a p-channel device, shifting the threshold voltage to the left and facilitating hole trapping. FIG. 3B shows two-terminal device operation wherein a p-channel device is formed.

Exemplary synaptic operation applicable to, for example, neuromorphic computing is described with respect to FIGS. 4A-G. A synaptic signal, various forms of which are possible, is chosen such that: 1) if applied as a pre-synaptic signal or a post-synaptic signal with no overlap within a time window, there is no (or negligible) net threshold voltage ($V_{th}$) shift; 2) if a pre-synaptic signal arrives within a time window before the post-synaptic signal, there is a net threshold voltage shift in one direction; 3) if a pre-synaptic signal arrives within a time window after the post-synaptic signal, there is a net threshold voltage shift in the other direction. Referring to FIGS. 4A-F, exemplary waveforms are shown for pre-synaptic and post-synaptic signals with respect to a synapse 20 and overlapping of such signals within a time window to cause net hole trapping in the channel. In the exemplary embodiment, the pre-synaptic signal ($I_{pre}$) arrives earlier than the post-synaptic signal ($I_{post}$) and there is net hole trapping within the channel.

Figure 4G:
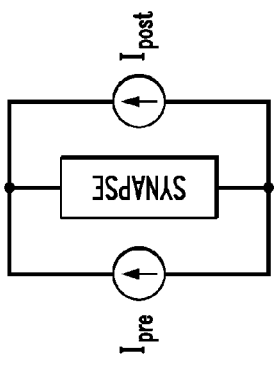
FIGS. 4A-G include schematic illustrations for exemplary synaptic operations.
Figure 4B:
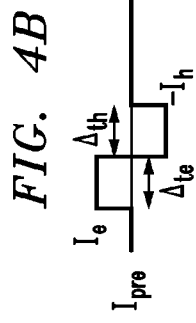
Figure 4D:
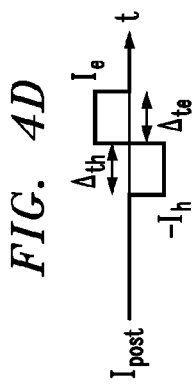
Figure 4F:
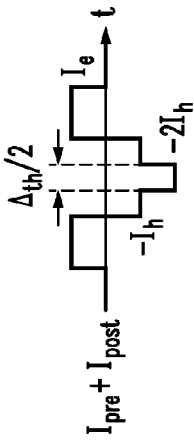
Figure 4A:
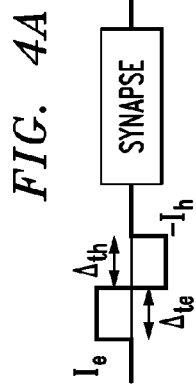
Figure 4C:
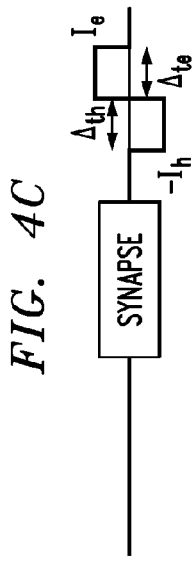
Figure 4E:
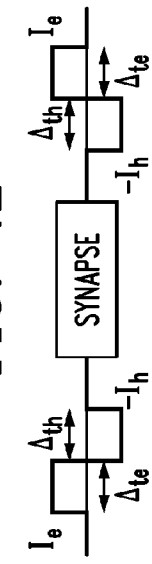

Referring to the exemplary waveforms of FIGS. 4B and 4D, $n_x(\Delta t_e)=C_e I_e(1-e^{-\Delta t_e/T_e})$ and $p_x(\Delta t_h)=C_h I_h(1-e^{-\Delta t_h/T_h})$ where $n_x$ is the net trapped electron concentration in the channel after the application of a negative pulse of duration $\Delta t_e$ as shown in the figures, $p_x$ is the net trapped hole concentration in the channel after the application of a positive pulse of duration $\Delta t_h$ as shown in the figures, $T_e$ and $T_h$ are characteristic time constants, and $C_e$ and $C_h$ are constant pre-factors. For simplicity assume, $I_e=I_h=I$, $\Delta t_e=\Delta t_h=\Delta t$, $C_e=C_h=C$, $T_e=T_h=T$. (In some embodiments, a lower limit to T is the transit time in the channel, while in other embodiments, a lower limit to T is the effective RC delay for switching the gate voltage.) If pre-synaptic or post-synaptic signals have no overlap, $n_x(\Delta t)=p_x(\Delta t)$; therefore to the first order there is no net excess charge trapping in the channel. If the pre-synaptic signal arrives earlier, as illustrated, $n_x-p_x=CI(1-e^{-\Delta t/T})-CI(1-e^{-\Delta t/2T})-2CI(1-e^{-\Delta t/2T})-CI(1-e^{-\Delta t/2T})+CI(1-e^{-\Delta t/T})=-CI(1-e^{-\Delta t/2T})^2$. Therefore, there is net hole trapping in the channel. Similarly, if the post-synaptic signal arrives earlier (not shown), there will be net electron trapping in the channel.

FIGS. 4B and 4D show exemplary waveforms of pre-synaptic and post-synaptic signals along a time axis t. Such signals can be generated, for example, by devices (not shown) acting as pre-synaptic or post-synaptic neurons. The addition of the overlapping signals is shown schematically in FIG. 4F.

In various systems comprised of non-crystalline materials including both inorganic and organic materials, there are multiple trapping levels, for example with a Gaussian distribution in the vicinity of a near mid-gap energy. In such systems charge trapping occurs over a range of time constants rather than a single time constant, i.e. $\Delta V_T=K(1-\exp(-\Delta t/T)^\beta)$ where $0<\beta<1$. Typically $0.2<\beta<0.6$. For learning windows of interest, $\Delta t<<T$ and $\Delta V_T \approx K(\Delta t/T)^\beta$, where $K=C(V_{GS}-V_T)$. In the linear regime, the excess charge in the channel is proportional to $V_{GS}-V_T$ and therefore to current, i.e. $\Delta V_{Te}=k_e \cdot I_e \cdot (\Delta t_e/T_e)^{\beta e}$ and $\Delta V_{Th}=k_h \cdot I_h \cdot (\Delta t_h/T_h)^{\beta h}$, where $k_e$ and $k_h$ are constant pre-factors. In the illustrated waveforms, for simplicity assume, $I_e=I_h=I$, $\Delta t_e=\Delta t_h=\Delta t$, $C_e=C_h=C$, $T_e=T_h=T$, $k_e=k_h=k$, $\beta_e=\beta_h=\beta$. If pre-synaptic or post-synaptic signals have no overlap, $\Delta V_T=\Delta V_{Th}-\Delta V_{Te}=0$. If the pre-synaptic signal arrives earlier, as illustrated, $\Delta V_T=\Delta V_{Th}-\Delta V_{Te}=2 \cdot k \cdot I \cdot (\Delta t/T)^\beta \cdot [1-2^{(1-\beta)}]<0$. Therefore, there is net hole trapping in the channel. Similarly, if the post-synaptic signal arrives earlier, there is net electron trapping.

Figure 5A:
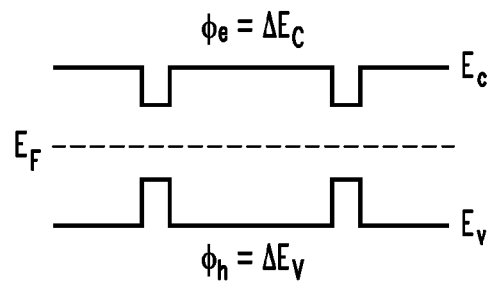
FIGS. 5A and 5B include schematic energy band diagrams showing the adjustment of quantum confinement by channel doping.
Figure 5B:
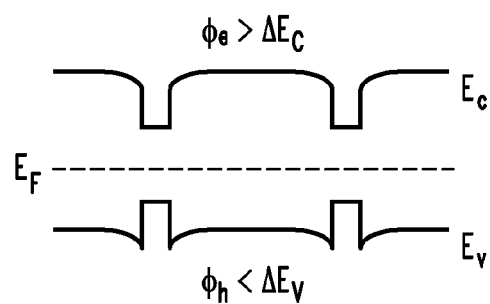

The devices discussed above may function as non-volatile or volatile memory. As known to those of skill in the art, the retention time is a function of the localization energy determined by quantum confinement in the well or dot. Estimated retention times of a wide variety of adjoining III-V materials have been calculated and are known in the art. For example, the storage times of Si/Ge and $GaAs_{0.4}Sb_{0.6}/GaAs$ are relatively low while the storage times of GaSb/GaAs, $In_{0.5}Ga_{0.5}Sb/GaAs$ and InSb/GaAs are relatively long. The localization energy depends on band offsets as well as doping and/or bias. Confinement can be adjusted by channel doping to, for example, reduce the confinement potential for holes, $\phi_h$, and increase the confinement potential for electrons, $\phi_e$ by p-type doping. FIGS. 5A and 5B provide schematic waveform diagrams illustrating quantum confinement adjustment. Metals in organic material also provide varying retention times. For example, gold nano-particles/nano-dots in pentacene exhibit a retention time of a few hours.

Figure 6A:
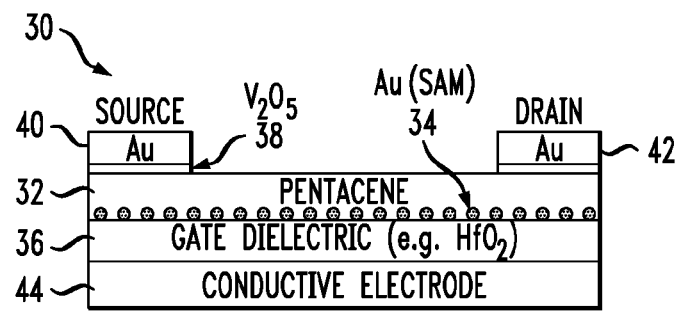
FIG. 6A is a schematic illustration of a lateral device including an organic channel.
Figure 6B:
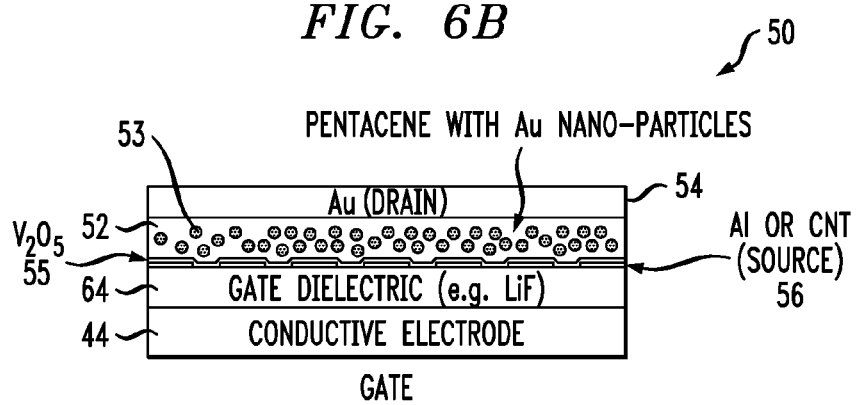
FIG. 6B is a schematic illustration of a vertical device having an organic channel.
Figure 6C:
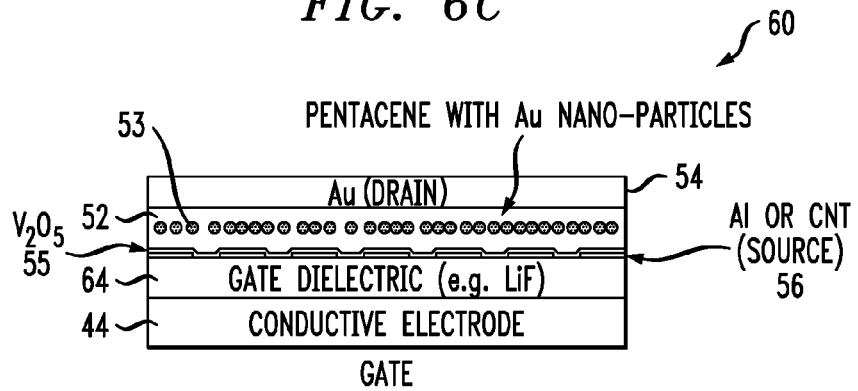
FIG. 6C is a schematic illustration of a vertical device having an organic channel and nano-dots randomly distributed within a plane in the channel.

Three exemplary embodiments of organic devices are provided in FIGS. 6A-6C. A lateral device 30 is shown in FIG. 6A. The device 30 includes a semiconductor layer that includes an organic (pentacene) channel region 32 and a self-assembled monolayer (SAM) 34 of gold that adjoins the gate dielectric layer 36, which is hafnium oxide in the exemplary embodiment. Pentacene has a transport bandgap, i.e. HOMO-LUMO separation of about 2.1 eV. (HOMO and LUMO signify highest occupied molecular orbital and lowest unoccupied molecular orbital, respectively). Gold nano-particles create deep states in pentacene and exhibit retention times exceeding one hour. A vanadium pentoxide ($V_2O_5$) layer 38 is provided between the pentacene channel and the source and drain electrodes 40, 42. This layer 38 enables ambipolar injection into the pentacene channel by adjusting the barrier height for carrier injection from the metal (e.g. Au or Al) contact 40 into pentacene. Other transition metal oxides such as $WO_3$, $TiO_2$, $MoO_3$, $Ta_2O_5$ or other materials such as LiF or Ca may be used as well. These layers are preferably thin (<10 nm) to avoid high series resistance at the source and the drain. Typically a high-workfunction metal contact enables efficient hole injection into the organic material, while a low-workfunction metal enables efficient electron injection. The interfacial layer 38 may be used to adjust the workfunction to an intermediate level or create interfacial states that facilitate efficient injection of both types of carriers. The interfacial layer is optional and may be omitted. Since carrier injection occurs at the source, the application of the interfacial layer 38 is only relevant to the source; however, it may be used in the drain as well, for example to allow a symmetric device (where source and drain electrodes may be used interchangeably) or to simplify the device fabrication. The device further includes a gate electrode 44, comprised of a conductive material or materials, such as metal, doped poly-Si, or other conductive material. In preferred embodiments, this device is fabricated on an insulating material and/or substrate (not shown).

A second exemplary device 50 is shown in FIG. 6B. An organic channel 52, which is a pentacene semiconductor layer in one or more embodiments of the device 50, contains gold nano-particles 53. In one example, the gold nano-particles are mixed in a solution containing a pentacene precursor such as 13,6-N-Sulfinylacetamidopentacene, and applied by spin-coating and cured to form a pentacene layer containing gold nano-particles. A solvent such as chloroform, chlorobenzene or combinations thereof may be used to prepare the solution. Curing may be performed at temperatures close to 200° C. in a dry atmosphere, although lower temperatures may be used as well. The drain 54 adjoins the top surface of the channel and may be fabricated from gold. An optional interfacial layer such as a vanadium pentoxide layer 55 adjoins the bottom surface of the channel 52 and the source layer 56 and facilitates ambipolar injection into the pentacene semiconductor layer. Aluminum (Al) and carbon nanotube (CNT) are among the materials that may comprise the source layer 56. The device further includes an electrically conductive electrode 44. The gate dielectric layer 64, which comprises lithium fluoride in one or more exemplary embodiments, is between the electrically conductive electrode 44 and the source layer 56. The exemplary vertical device 50 facilitates relatively high current densities.

A third exemplary organic device 60, shown in FIG. 6C, is the same as that shown in FIG. 6B except that the gold nano-dots 53 are randomly distributed within a plane rather than within the volume of pentacene. The same reference numerals are employed as in FIG. 6C to designate the same elements found in FIG. 6B. In one example, this is achieved by thermally evaporating a first layer of pentacene, followed by the formation of gold nano-dots by flash-evaporation of gold, and thermally evaporating a second layer of pentacene. In the flash evaporation method, gold is evaporated in a vacuum chamber and a shutter (used for physically blocking the sample from gold evaporation) is opened only for a short period of time to allow gold deposition on the sample. (When the shutter is closed, gold deposits on the shutter rather than on the sample.) Such short deposition times result in nano-dot formation on the surface rather than a continuous layer of gold. In one example, an evaporation rate of 1 Å/sec and an evaporation time (the period the shutter is open) of 5 sec is used. In another example, an evaporation rate of 0.1 Å/sec and an evaporation time of 50 sec is used. In another example, an evaporation rate of 1 Å/sec and an evaporation time of 10 sec is used. The evaporation rate and time are chosen such that the product of the evaporation time and evaporation rate is preferably lower than 2 nm and more preferably lower than 1 nm. Gold evaporation is preferably performed in the same evaporation chamber as that used for pentacene evaporation.

Figure 6D:
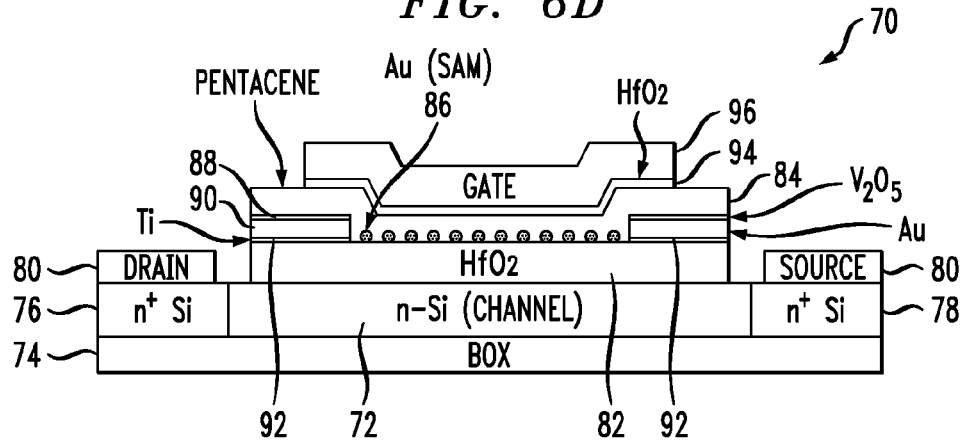
FIG. 6D is a schematic illustration of a lateral device including a silicon channel.

A fourth exemplary organic device 70, shown in FIG. 6D, includes a silicon layer formed on an insulating layer 74 such as a buried oxide (BOX) layer. The silicon layer has been processed to provide an n-Si channel 72 and adjoining n+ regions 76, 78 using techniques familiar to those of skill in the art. Contacts 80 adjoin the top surfaces of the n+ regions. A dielectric layer 82, hafnium oxide in one or more exemplary embodiments, adjoins the top surface of the channel. An organic semiconductor (e.g. pentacene) layer 84 containing a self-assembled monolayer (SAM) 86 of gold adjoins the dielectric layer 82. Self-assembly of gold nano-particles on metal oxides (e.g. aluminum oxide, hafnium oxide) can be achieved by procedures known to the art. In one exemplary procedure, the oxide surface is coated with a monolayer of a bifunctional compound having a functionality that adheres to the surface of the oxide (e.g. hydroxamic acid, phosphonic acid) and a charge moiety. For example, pyridine hydroxamic acid methiodide has a hydroxamic acid functionality which self assembles on metal oxide surfaces and a charged moiety (pyridinium salt). After self-assembly of this molecule to form a monolayer on the oxide surface, the positive surface charge of the self-assembled monolayer (SAM), attracts negatively charged molecules or particles. Gold nanoparticles are coated with a ligand. In the case of water soluble gold nanoparticles, the ligand is usually is a charged molecule such as citrate salt which carries a negative charge on the surface of gold nanoparticles. Therefore, when a substrate with positively charged SAM is immersed in a solution of negatively charged gold nanoparticles, the gold particles are attracted to positively charged SAM through coulombic attraction, forming electrostatic bonds and adhering to the surface of the oxide substrate. In one exemplary alternative procedure, molecules having hydroxamic functionality that causes adherence to an oxide surface and thiol functionality that can attract gold nanoparticles from solution (water or solvent) is employed. Stacks including a transition metal-oxide (e.g. vanadium pentoxide) layer 88, a gold layer 90, and a titanium layer 92 are provided between the organic semiconductor layer 84 and the dielectric layer 82, the titanium layer contacting the dielectric layer. A second dielectric layer 94, also hafnium oxide in some embodiments, is formed on the organic semiconductor layer 84. A gate 96 (e.g. aluminum) adjoins the second dielectric layer 94. The channel conductivity of the device 70 is modulated in depletion or accumulation depending on the charge type of the gold comprising the SAM layer 86 and value as programmed by the control gate. At positive gate voltages, holes are injected into pentacene from the contact regions 92/90/88, resulting in net positive charge trapping in the Au nanoparticles. At negative gate voltages, electrons are injected into pentacene from the contact regions 92/90/88, resulting in net negative charge trapping in the Au nanoparticles. Similar to previous exemplary embodiments discussed above, "net" positive charge trapping refers to trapping of positive charge, detrapping of negative charge, recombination of positive charge with pre-existing negative charge (if present), and combinations thereof. Similarly, "net" negative charge trapping refers to trapping of negative charge, detrapping of positive charge, recombination of negative charge with pre-existing positive charge (if present), and combinations thereof. If the net charge trapped in the Au nanoparticles is positive, electrons in the n-Si channel are attracted to the n-Si/dielectric 82 interface, creating an electron accumulation layer. If the net charge trapped in the Au nanoparticles is negative, electrons in the n-Si channel are repelled from the n-Si/dielectric 82 interface, creating an electron depletion layer. The conductivity of the n-Si channel is therefore modulated (increased with accumulation and decreased with depletion) depending on the polarity and amount of charge stored in the Au nanoparticles. In the disclosed structure of the device 70, while charge trapping takes place within an organic material 84 (e.g. pentacene), the channel 72 whose conductivity is modulated is comprised of an inorganic material (e.g. Si). As known in the art, typical inorganic materials such as Si have higher carrier mobility and are more stable than organic materials such as pentacene. As a result, the disclosed structure of the device 70 facilitates stability and reduced "on" resistance. In some embodiments (not shown) the Au nano-particles may be disposed at a distance from the dielectric 82 (e.g. using the techniques described for FIG. 6C) or distributed randomly inside the organic material (e.g. using the techniques described for FIG. 6B). The devices 30, 50, 60 and 70 are employable as synapses as discussed above with respect to FIGS. 4A-G.

Figure 7A:
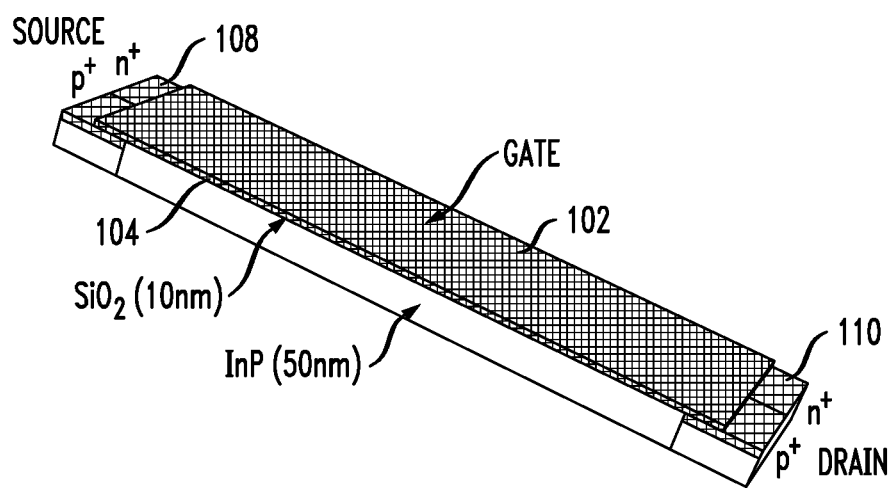
FIGS. 7A and 7B are schematic top and bottom perspective views of a compound semiconductor device including quantum wells.
Figure 7B:
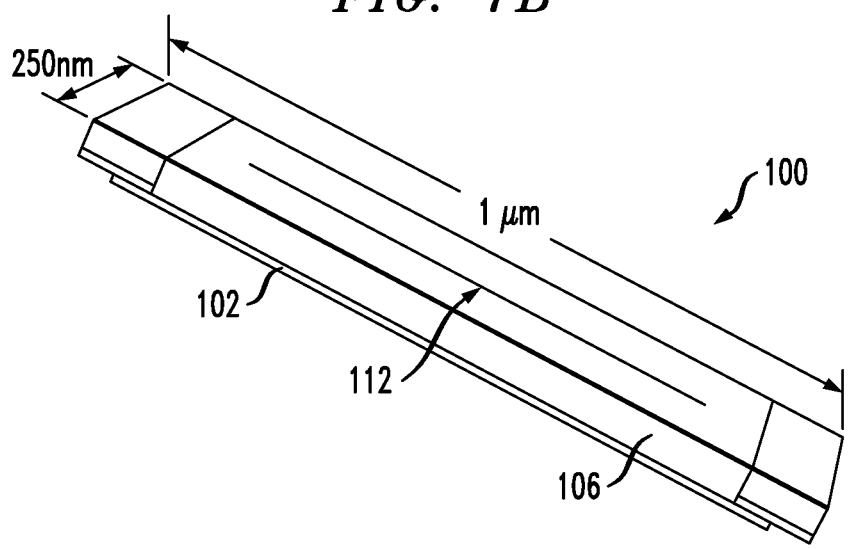

FIGS. 7A-B show a compound semiconductor device 100 that facilitates trapping and recombination/de-trapping of electrons and holes and which can be incorporated as part of an electronic memory. As shown in the top perspective view provided by FIG. 7A, the device 100 includes a gate 102 (e.g. aluminum or other metal or electrically conductive material) and an adjoining gate dielectric layer 104. The gate dielectric layer is a silicon dioxide layer in one or more embodiments and has a thickness of ten nanometers. An indium phosphide (InP) layer 106 functions as a channel layer in the device 100. The channel layer has a thickness of fifty nanometers in one or more embodiments. Source and drain regions 108, 110 adjoin the InP layer 106. Each of these regions is comprised of both p+ and n+ doped InP that are electrically isolated from the gate 102. The p+ and n+ doped regions are efficient in injecting holes and electrons into the channel, respectively. As a result, the source and drain regions can efficiently inject both electrons and holes into the channel layer, depending on the gate voltage that determines the electric potential of the channel. The width and length of the exemplary device are 250 nanometers and 1 micron, respectively. The width and length of the source and drain regions are 250 nm and 100 nm, respectively.

Referring to FIG. 7B, which provides a bottom perspective view of the device 100, indium arsenide (InAs) quantum wells 112 are formed in the indium phosphide layer 106. Growth of InAs quantum structures, namely quantum wells and quantum dots, in InP is well known to those of skill in the art. The width and length of the InAs quantum well is 0.4 and 600 nanometers, respectively. The thickness of the InAs quantum well is 50 nm, i.e. extending from the bottom surface of the device (topmost surface in FIG. 7B) to the $SiO_2$ dielectric layer. The bandgap of InAs is 0.418 eV while the bandgap of InP is 1.424 eV. The conduction band offset between InP and InAs is 0.41 eV and the valence band offset is 0.60 eV. A quantum well is formed for electrons in InAs due the presence of the conduction band-offset between InP and InAs, while a quantum well is formed for holes in InAs due the presence of the valence band-offset between InP and InAs. At negative gate voltages, holes are injected from the source/drain into the channel and therefore net positive charge trapping occurs in InAs. At positive gate voltages, electrons are injected from the source/drain into the channel and therefore net negative charge trapping occurs in InAs. A net positive charge trapping results in a positive shift of the threshold voltage while a net negative charge trapping results in a negative shift of the threshold voltage. The conductivity of the channel and therefore the transistor current is modulated accordingly.

Figure 8B:
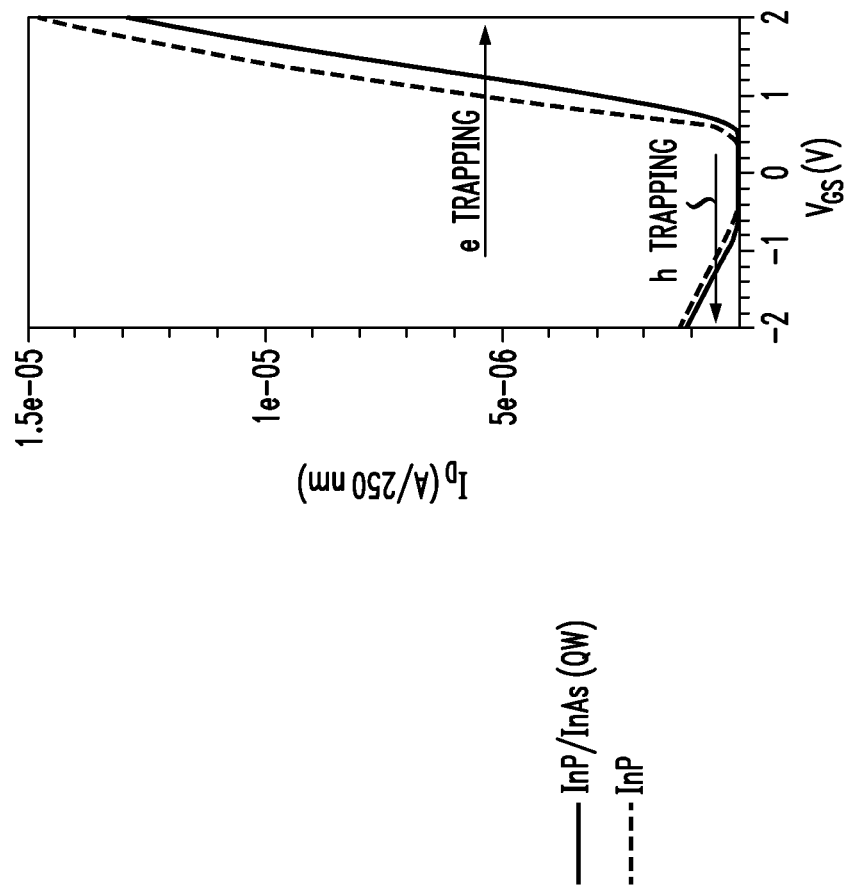
FIG. 8B is a graph showing maximum ambipolar threshold voltage shift possible in each direction with respect to the device shown in FIGS. 7A and 7B.
Figure 8A:
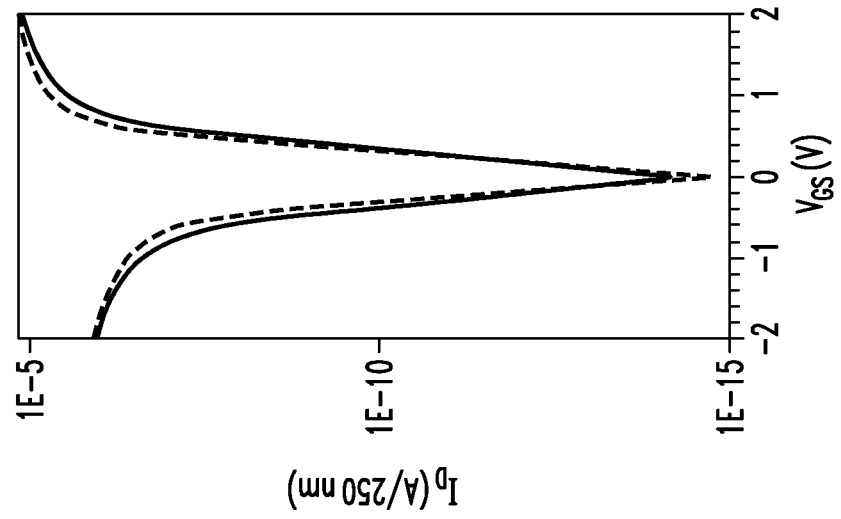
FIG. 8A is a graph showing steady-state simulation of the device shown in FIGS. 7A and 7B with thermionic emission turned off.

Operating results of the exemplary III-V device 100 are shown in the technology computer aided design (TCAD) simulation graphs provided in FIGS. 8A and 8B. FIG. 8A shows a steady-state simulation with thermionic emission turned off. Thermionic emission refers to the heat induced flow of charge carriers. No thermionic emission means that the carriers trapped in the quantum well are not allowed to escape the quantum well by thermalization (i.e. gaining thermal energy). A steady-state simulation with thermionic emission turned off therefore shows the maximum possible charge trapping in the InAs quantum well and therefore the maximum shift of the threshold voltage possible. As known in the art, the maximum possible charge trapped in a quantum well is dependent on the depth of the quantum well (determined by the band-offsets in this embodiment) as well as the dimensions (width and length) of the quantum well. FIG. 8B shows the maximum ambipolar threshold voltage shift possible in each direction, one direction resulting from electron trapping, the other direction resulting from hole (h) trapping. The maximum threshold voltage shift can be increased by including more InAs quantum wells in the channel. Combinations of other III-V materials, II-VI materials and elemental semiconductors may be also employed to implement such devices.

Figure 9B:
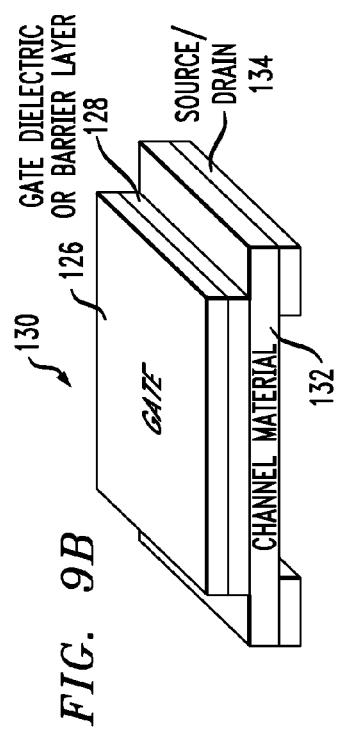
FIGS. 9A and 9B are schematic illustrations of exemplary ambipolar synaptic devices.
Figure 9A:
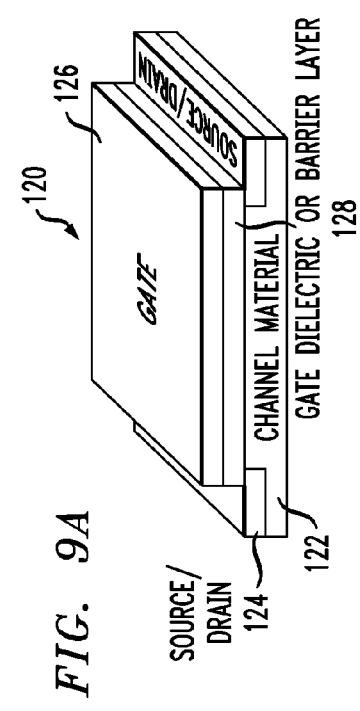

Further exemplary embodiments are shown in FIGS. 9A and 9B. Both metal-oxide-semiconductor (MOS) and high-electron-mobility transistor (HEMT) devices may be configured for trapping and de-trapping and/or recombination of both electrons and holes. FIG. 9A shows a device 120 wherein the source/drain regions 124 are formed within the layer that further comprises the channel 122, for example by doping. A gate 126 and gate dielectric or barrier layer 128 are positioned on the channel. A HEMT device would be formed if a barrier is employed to form layer 128 rather than a dielectric material. FIG. 9B shows an alternative structure 130 wherein the source/drain regions 134 are formed beneath the layer 132 comprising channel material on the side of the device opposite from the gate. Conventional CMOS processing may be employed in one or more embodiments. The source/drain regions of both structures 120, 130 are configured for injecting both electrons and holes into the channels.

Figure 10B:
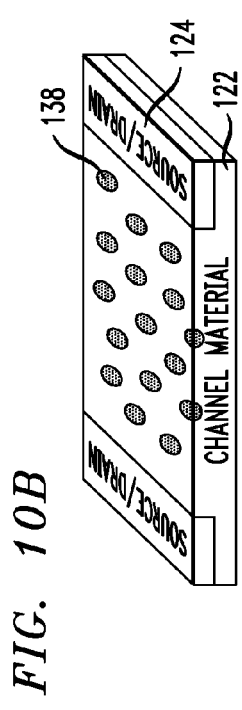
FIGS. 10A-D are schematic illustrations of exemplary arrangements of quantum structures within channel layers.
Figure 10A:
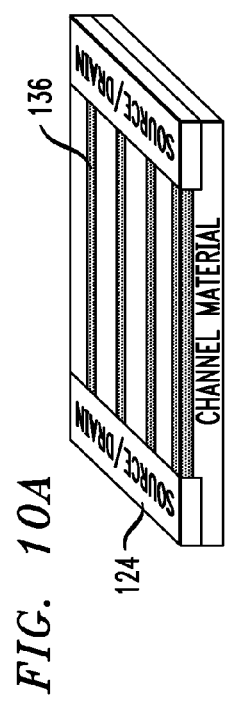
Figure 10D:
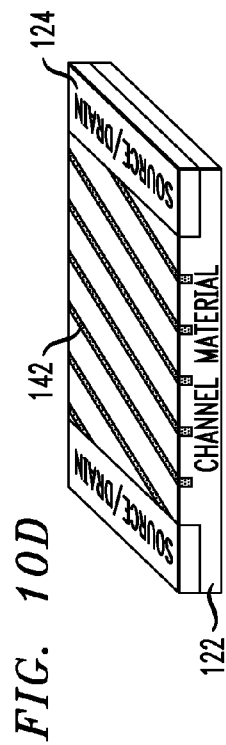
Figure 10C:
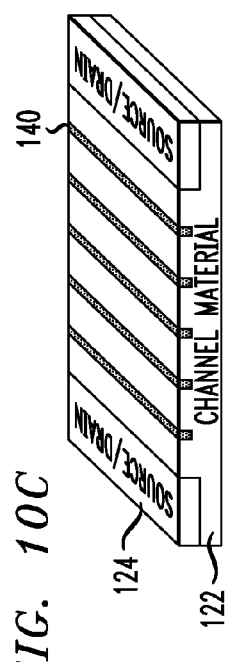

FIGS. 10A-D show alternative embodiments of the device 120 with the gate and dielectric/barrier layers removed for illustrative purposes. Various arrangements of quantum wells/dots (ordered or random) are possible. FIG. 10A illustrates a device including quantum wells 136 parallel to current flow. FIG. 10B illustrates a device comprised of quantum dots 138. The embodiment of FIG. 10C shows quantum wells 140 extending within the channel layer 122 and perpendicular to the current path. Quantum wells 142 extend diagonally with respect to the channel in the embodiment of FIG. 10D. In the embodiments of FIGS. 10A and 10B, the quantum wells extend all the way from the source to the drain. In some embodiments (not shown), the quantum wells do not extend all the way to drain side and/or all the way to the source side. In the embodiments of FIGS. 10A, 10B, 10C and 10D, the thickness of the drain and source regions and the thickness of the quantum wells/dots are smaller than the thickness of the channel material. In some embodiments (not shown), the thickness of the quantum wells/dots and/or the thickness of the source/drain regions is equal to the thickness of the channel material.

Figure 11A:
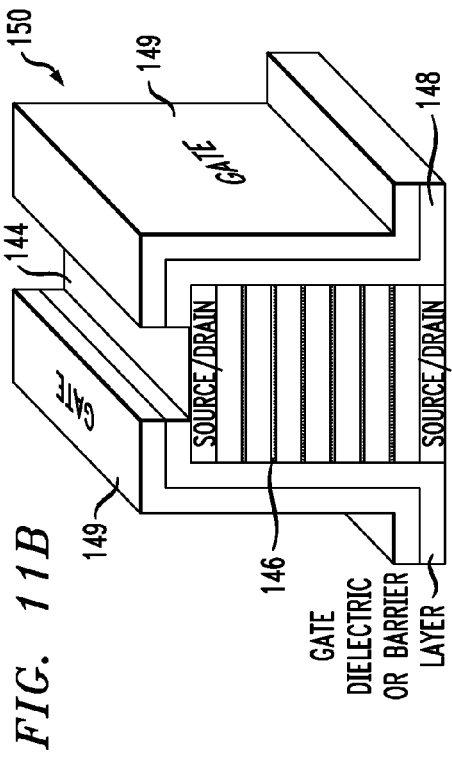
FIGS. 11A-D are schematic illustrations of exemplary device architectures including channels containing quantum wells.
Figure 11B:
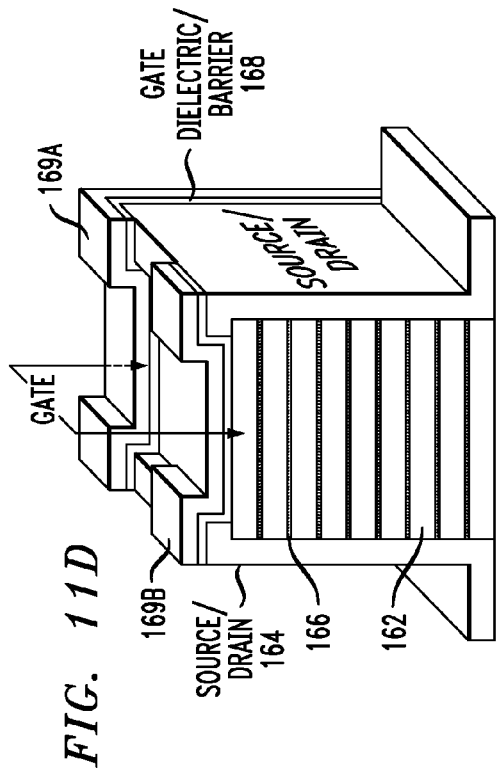
Figure 11C:
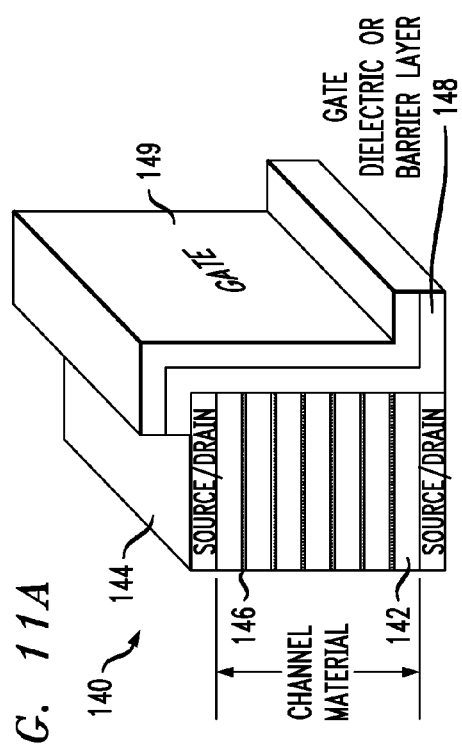
Figure 11D:
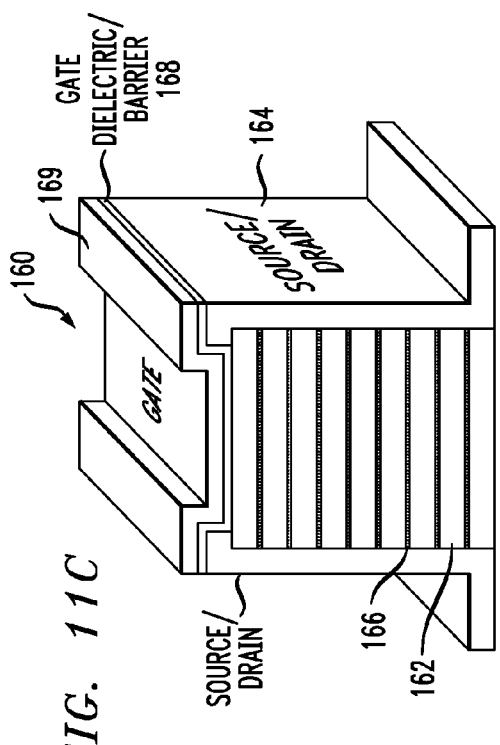

Various device architectures in addition to the lateral-type structures 120, 130 shown in FIGS. 9A and 9B may be employed for providing carrier confinement in accordance with the teachings herein. FIGS. 11A-D show four exemplary schematic embodiments. Referring to FIG. 11A, a single-gate device 140 is shown. The device includes a semiconductor layer 142 containing channel material and quantum wells 146 between source/drain regions 144. The source/drain regions are configured for injecting both electrons and holes into the channel portion while the channel portion of the layer 142 is capable of effecting both net negative charge trapping and net positive charge trapping. The type of trapping that occurs depends on whether electrons or holes are injected into the channel. A gate dielectric or barrier layer 148 is provided between the gate 149 and the channel layer 142. FIG. 11B shows a double-gate device 150. The same reference numbers are employed in FIGS. 11A and 11B to designate the same or substantially similar elements. The device 160 shown in FIG. 11C is another configuration that may be employed. The exemplary device includes a single gate 169 and associated dielectric or barrier layer 168. Source/drain regions 164 adjoin the channel layer 162. The quantum wells 166 are parallel to current flow in this embodiment. FIG. 11D shows a device 170 similar to that shown in FIG. 11C, but includes two gates 169A and 169B rather than one. It will be appreciated that single-gate, double-gate, or "gate all-around" (not shown) devices, for example with a gate around a fin or nano-wires may be fabricated for trapping and de-trapping both types of carriers. Vertical structures, such as shown in FIGS. 11A-D are relatively simple to fabricate through epitaxial growth, but lateral structures are also viable, for example, in III-V materials systems.

Figure 12A:
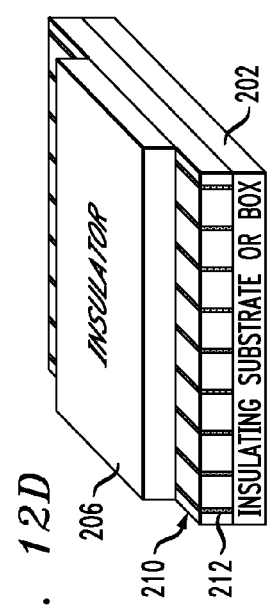
FIGS. 12A-F is a schematic flow diagram showing an exemplary method of fabricating a lateral device.
Figure 12D:
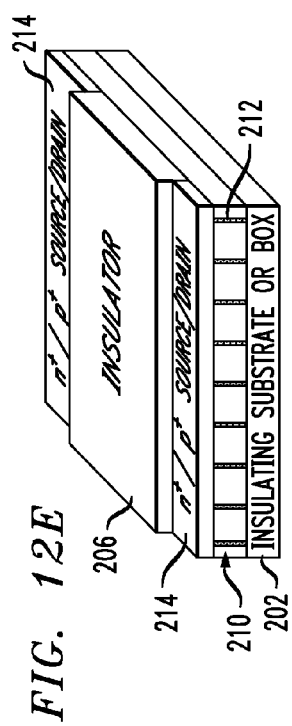
Figure 12B:
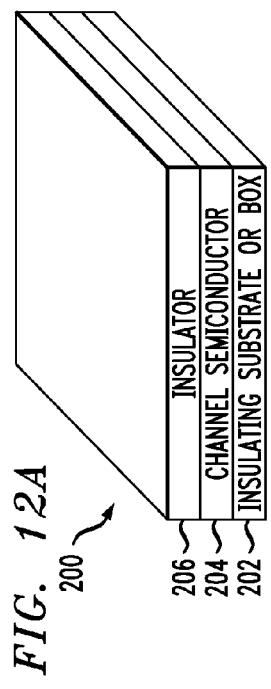
Figure 12E:
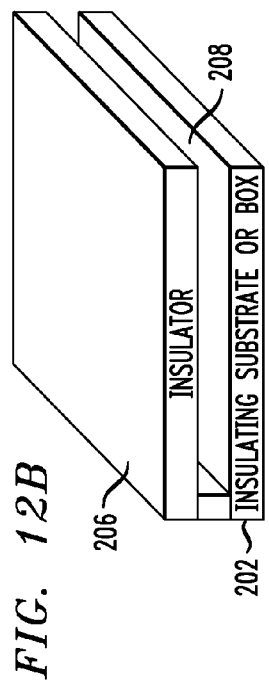
Figure 12C:
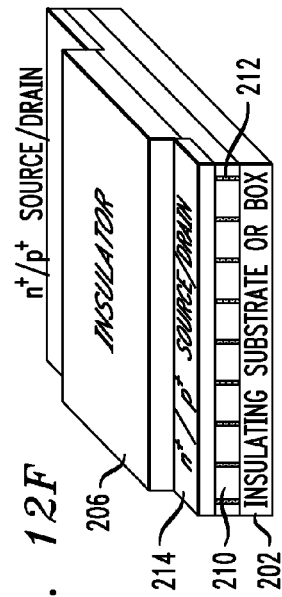
Figure 12F:
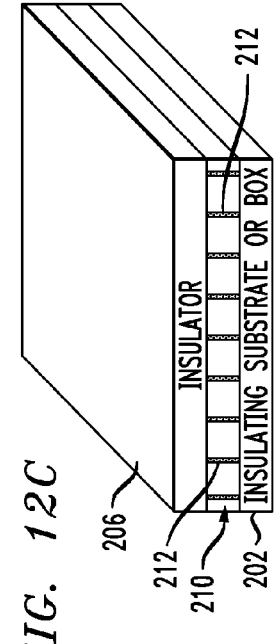

Referring to FIGS. 12A-F, an exemplary method is shown for forming a lateral epitaxial device in accordance with one or more embodiments. A starting substrate 200 includes an electrically insulating layer 202, a semiconductor layer 204, and an insulator layer 206 on the semiconductor layer. The thickness of the channel semiconductor material 204 may be in the range of 20-100 nm, although thinner or thicker layers may be used. The width of the quantum wells 212 may be in the range of 0.1-0.5 nm although wider or narrower quantum wells may be used as well. The insulating layer 202 is a buried oxide layer in some embodiments. The substrate 200 is subjected to selective etching of the semiconductor layer 204, thereby forming a space 208 between the electrically insulating layers 202, 206 as shown in FIG. 12B. A channel layer 210 is formed within the space 208 by lateral epitaxy. Referring to FIG. 12C, the channel layer 210 is formed, for example, from semiconductor materials having different bandgaps, forming deep quantum wells 212 in the channel layer that can function as ambipolar traps. Exemplary semiconductor materials are identified below in the discussion of the device 300 shown in FIG. 15. The insulator layer 206 is patterned as shown in FIG. 12D to expose portions of the channel layer 210 and quantum wells 212 formed therein. Source/drain regions 214 are formed epitaxially on the exposed portions of the channel layer as shown in FIG. 2E. Containing both n+ and p+ regions, the source/drain regions 214 are configured to inject both electrons and holes into the channel layer 210. In the exemplary embodiment, the quantum wells are parallel to the current flow of the finished device. In an alternative embodiment shown in FIG. 12F, the exposed portions of the channel layer are recessed, for example by selective etching, prior to source/drain epitaxy. The exposed portions of the channel layer may, in some embodiments (not shown), be fully recessed down to the insulating layer 202 prior to source/drain epitaxy.

Figure 13A:
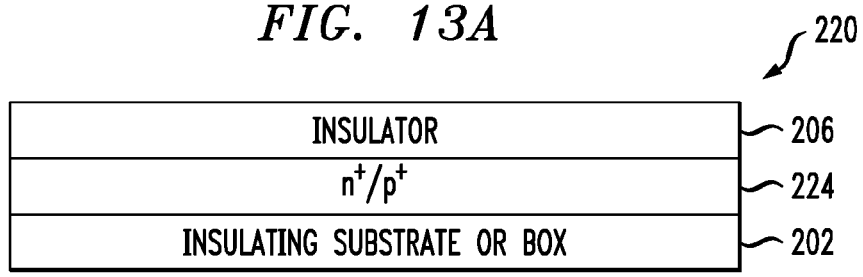
FIGS. 13A-D is a schematic flow diagram showing an alternative exemplary method of fabricating a lateral device.
Figure 13B:
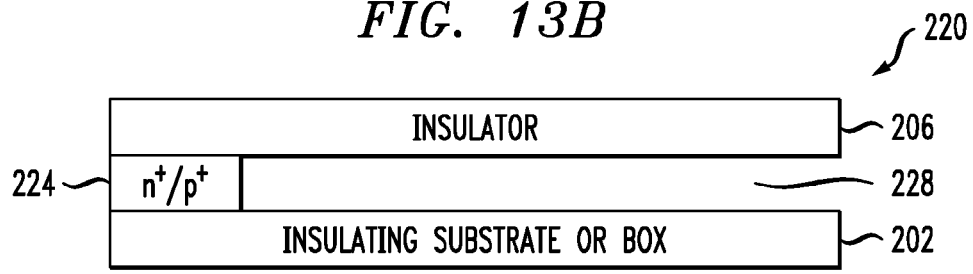
Figure 13C:
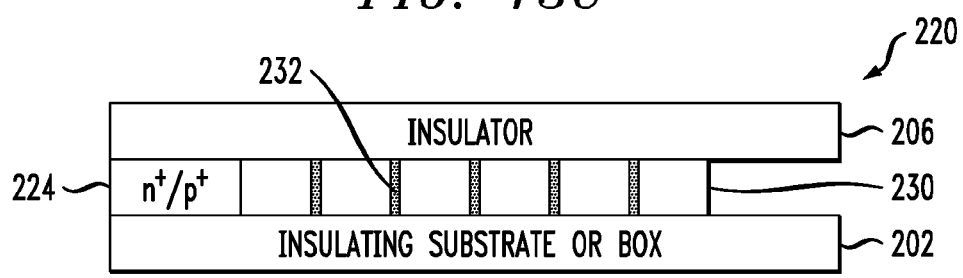
Figure 13D:
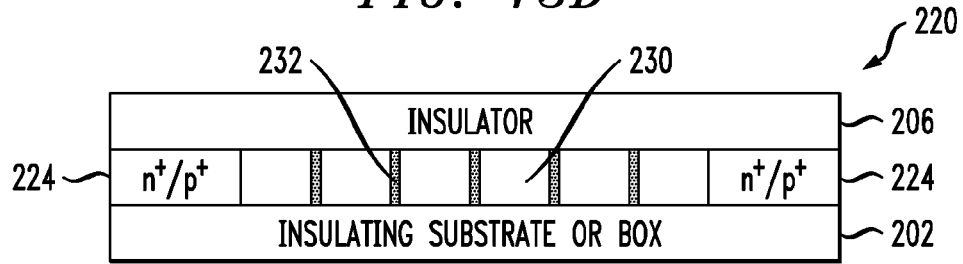

FIGS. 13A-13D show schematically illustrated fabrication steps in accordance with a further exemplary embodiment. A starting substrate 220 includes electrically insulating layers 202, 206 as described above with respect to FIGS. 12A-F. A semiconductor layer 224 including n+/p+ regions is provided between the insulating layers. The substrate 220 is subjected to lateral, selective etching to partially remove the semiconductor layer 224. Such removal causes the formation of a space 228 between the insulating layers and adjoining the remaining portion of the n+/p+ semiconductor layer 224, as shown in FIG. 13B. Lateral selective growth of a channel layer 230 with quantum wells 232 within the space 228 results in a structure shown in FIG. 13C. The remaining space between the insulating layers 202, 206, which either remains following channel formation or is provided by selective etching of the channel material(s), is filled by lateral selective growth of a n+/p+ region 224 that may be similar or identical to the remaining portion of the n+/p+ semiconductor layer 224. The n+/p+ regions are functional as source/drain regions and hole and electron injection regions in the finished device. It will be appreciated that further fabrication steps, such as gate formation, are conducted following the processes discussed above with respect to FIGS. 12A-F and 13A-D.

Ambipolar synaptic devices in accordance with exemplary embodiments include material(s) capable of injecting both electrons and holes into the channels thereof. In some exemplary embodiments, source/drain regions including combinations of highly doped n-type and p-type (n+ and p+) materials are employed for this purpose. FIGS. 14A-F provide schematic illustrations of exemplary source/drain regions comprising both n+ and p+ materials. Referring to FIG. 14A, the source/drain region 240 includes n+ and p+ regions formed in a side by side configuration. The source/drain region 250 shown in FIG. 14B includes n+ and p+ regions, one positioned in front of the other. In the embodiment 260 of FIG. 14C, one of the regions is positioned on top of the other region. The n+ region may be formed as the top or bottom layer in this embodiment. The source/drain region 270 illustrated in FIG. 14D includes four discrete regions, two being n+ and two p+. The n+ regions adjoin only p+ regions in this embodiment. The source/drain region 280 shown in FIG. 14E includes two p+ and two n+ regions formed in alternating sequence, one in front of the other. Finally, the source/drain region 290 shown in FIG. 14F includes a p+ (n+) region confined within a n+ (p+) region. The examples of source/drain regions provided herein is to be considered illustrative as opposed to limiting. In some embodiments (not shown) source and drain regions may be comprised of ohmic or Schottky contacts comprised of metal or silicide. As known in the art, ambipolar injection from metal or silicide into semiconductors may be possible. However, the efficiency of ambipolar injection depends on the metal or silicide material as well as the interface quality between the metal/silicide and the semiconductor.

An exemplary ambipolar synaptic device 300 is shown in FIG. 15. The device includes source/drain regions 302, each of which includes a n+ (or p+) region 302' confined within a p+ (or n+) region. The device further includes an n− (or p−) channel 304 to reduce "off" current as compared with, for example, an intrinsic or nearly intrinsic channel. Such reduction is obtained because the barrier for carrier injection at the source for both types of carriers (electrons and holes) in the subthreshold regime is increased. The device 300 further includes a gate 306 adjoining a gate dielectric or barrier layer 308, the latter being employed for a HEMT device. At least one of the channel 304 and gate dielectric or barrier layer 308 is provided with quantum wells or dots.

Preferably, lattice-matched or nearly lattice-matched single-crystalline materials are used to form the quantum wells or quantum dots with respect to the channel in embodiments where the channel contains such structures. As known in the art, lattice mismatch may be tolerated to a limited extent. Examples of lattice-matched materials systems include:

$In_{0.53}Ga_{0.47}As/InP$
$GaAs_{0.51}Sb_{0.49}/InP$
$In_{0.53}Ga_{0.47}As/In_{0.52}Al_{0.48}As$
$GaAs_{0.51}Sb_{0.49}/In_{0.52}Al_{0.48}As$
Ge/GaAs
Ge or $GaAs/In_{0.5}Ga_{0.5}P$ or $Al_xGa_{1-x}As$
$GaN/Al_xGa_{1-x}N$
Si/GaN or GaP

Non-crystalline materials may alternatively be employed to form channels comprising quantum wells. Exemplary materials include: a-Ge:H, a-SiGe:H, a-SiC:H, a-Ge:H, a-SiNx:H, a-SiOx:H or combinations thereof. Micro/nano-crystalline forms thereof may be used as well. Non-crystalline materials need not be lattice matched. Various dielectric materials or barrier layers as known in the art may be used in association with the gate structure.

Figure 16:
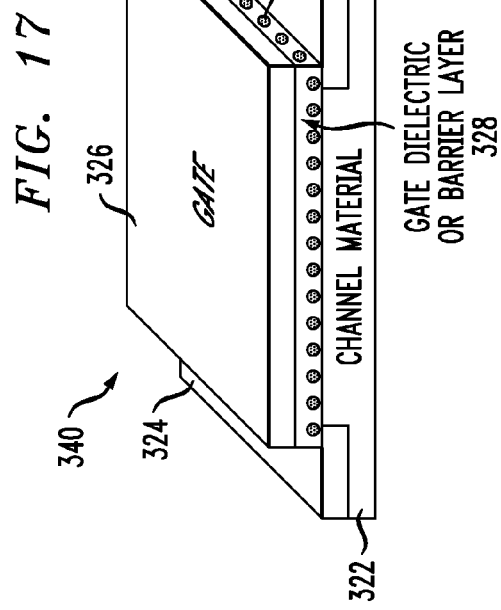
FIG. 16 is a schematic illustration of an ambipolar synaptic device including quantum wells in a gate dielectric layer or a barrier layer.
Figure 17:
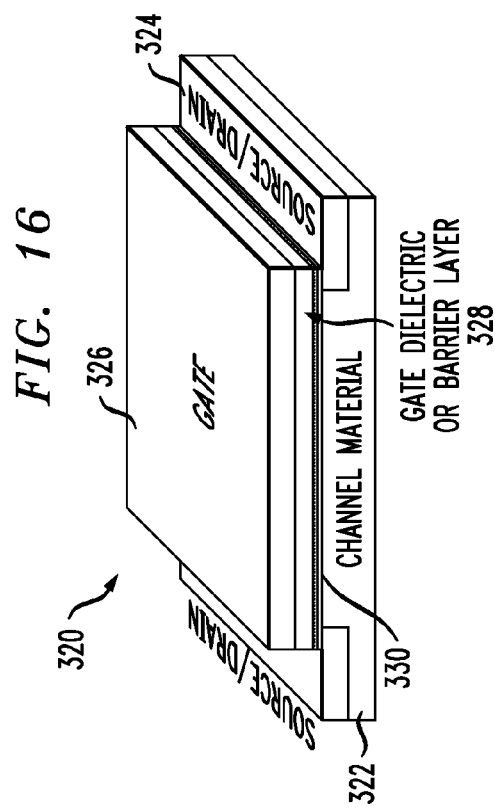
FIG. 17 is a schematic illustration of an ambipolar synaptic device including quantum dots in a gate dielectric layer or a barrier layer.

As indicated above, quantum wells or dots can be provided within either the channels or the dielectric/barrier layers of the exemplary devices. Embodiments in which such structures are provided in the channels are discussed above. Referring to FIG. 16, a device 320 including an ambipolar gate dielectric or barrier layer having quantum wells is shown. The device includes a gate (e.g. aluminum) 326, the gate dielectric or barrier layer 328, a channel 322 adjoining the gate dielectric and barrier layer, and source/drain regions 324 for injecting both electrons and holes into the channel 322. The gate dielectric or barrier layer 328 rather than the channel includes quantum wells 330 in the exemplary embodiment. FIG. 17 shows an alternative embodiment of such a device 340 including a gate dielectric or barrier layer 328 including quantum dots 332. The same reference numerals are employed in FIGS. 16 and 17 to designate similar elements. The arrangements of the quantum wells and quantum dots may be different from those shown in the illustrative embodiments of FIGS. 16 and 17. In some embodiments, deep localized states may function as ambipolar traps and partially or fully replace quantum wells or quantum dots. In some embodiments, for example embodiments comprising hydrogenated amorphous gate dielectric materials, carrier trapping in quantum wells, dots or deep localized states is facilitated by trap-assisted tunneling.

Figure 18A:
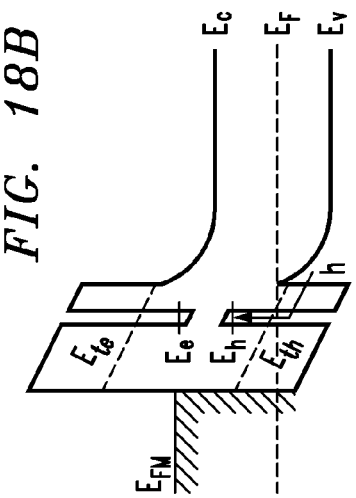
FIG. 18A is a schematic energy band diagram showing electron trapping with a positive bias on an ambipolar synaptic device as shown in FIGS. 16 and 17.
Figure 18B:
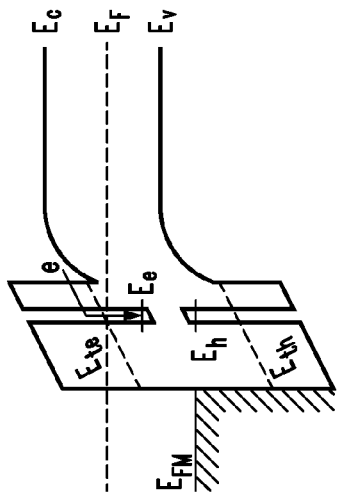
FIG. 18B is a schematic energy band diagram showing hole trapping with a negative bias on an ambipolar synaptic device as shown in FIGS. 16 and 17.

FIGS. 18A and 18B provide schematic energy band diagrams that illustrate, respectively, electron trapping resulting from a positive bias and hole trapping resulting from a negative bias, respectively, using ambipolar dielectric/barrier layers. The energy levels $E_e$ and $E_h$ denote the confinement energies for electrons and holes in the quantum well/dot respectively. The energy levels $E_{te}$ and $E_{th}$ denote the optionally present trap states that facilitate carrier trapping in the quantum well via trap-assisted tunneling.

A gate dielectric in a MOS device (or a barrier layer in HEMT) capable of trapping both electrons and holes may be used instead of channel trapping, as discussed above with respect to FIGS. 16-18. In the case of a high-electron-mobility transistor or HEMT, a barrier layer including quantum wells or defect states capable of capturing both types of carriers (holes and electrons) may be used. It should be noted that electrons and holes may be captured or released from different traps/locations. In the case of MOS devices, a dielectric layer is provided that includes deep traps capable of capturing both electrons and holes, possibly at different locations. Exemplary embodiments include dielectric layers including a-SiN$_x$:H, a-SiO$_x$:H or a-SiN$_x$O$_y$:H. In some embodiments, the gate stack may include a thin layer of a-Si:H, a-Ge:H, a-SiC:H, a-GeC:H or combinations thereof between the channel and the gate dielectric. Nano/micro-crystalline materials of the mentioned compositions may be used as well. In some embodiments, the gate dielectric may include quantum dots (materials having lower bandgap) within the gate dielectric, e.g. an SiN$_x$ gate dielectric with randomly distributed Si nano-dots.

Synaptic operation of devices having ambipolar dielectric or barrier layers is similar to the operation of quantum wells or dots in the channel; however, the time and bias dependence of carrier trapping is different. As known in the art, the gate voltage dependence may be an exponential, power law or combinations thereof. The time dependence is generally of the form $\log(1+t/t_0)$ where $t_0$ is a characteristic constant.

Given the discussion thus far and with reference to the exemplary embodiments discussed above and the drawings, it will be appreciated that, in general terms, an exemplary ambipolar synaptic device is provided that includes a semiconductor layer, a gate operatively associated with the semiconductor layer, a first structure is configured for injecting both electrons and holes into the semiconductor layer and a second structure that is configured for trapping, de-trapping and/or the recombination of both electrons and holes injected by the first structure into the semiconductor layer. In some embodiments of the device such as described above with respect to FIG. 6A, the semiconductor layer is comprised of an organic material and includes a channel region. A self-assembled monolayer 34 of gold adjoins a gate dielectric layer 36 and the channel region comprises the second structure. In a further exemplary embodiment of the ambipolar synaptic device as described above with respect to FIG. 6B, the channel region 52 contains nanoparticles 53, the channel region comprising the second structure where carriers are trapped, de-trapped and/or recombined. In some embodiments, the channel region comprises the second structure and the first structure, which is configured for injecting both electrons and holes, includes a transition metal oxide (e.g. vanadium pentoxide) layer 38, 55 adjoining the channel region. The discussion of FIGS. 6A-C relates to such a structure. In another embodiment (FIG. 6D), the channel 72 is isolated from the first and second structures by a dielectric layer 82 and the net trapped charge in the second structure (semiconductor layer 84) induces accumulation or depletion in the channel material via the capacitive coupling between the second structure and the channel. In one or more embodiments of the device, the channel includes a compound semiconductor layer containing quantum structures such as quantum dots or wells and the source/drain structures include n+ and p+ regions for injecting electrons and holes into the channel. FIGS. 7A-B illustrates an exemplary embodiment including a compound semiconductor layer that forms a channel between source/drain regions. One or more embodiments of the device include a layer of semiconductor material containing quantum dots (nanoparticles) and forming a channel. The quantum dots can be ordered or random. FIG. 10B shows an exemplary structure including such a channel. The channel in some embodiments includes quantum wells extending between the source/drain structures, as described above with respect to FIGS. 10A and 11C. Such wells are substantially parallel to the current flow of the device. In some embodiments of the ambipolar synaptic device, source/drain structures comprised of a highly doped region of a first doping type confined within a highly doped region of a second doping type are provided for injecting both electrons and holes into the channel. FIG. 14F and FIG. 15 show such source/drain structures. In the embodiment of FIG. 15, for example, a n+ region is confined by a p+ region. The layer between the gate and channel includes quantum structures or defect states capable of capturing both electrons and holes in some embodiments, as described above with respect to FIGS. 16 and 17. The layer is a gate dielectric layer in MOS devices and a barrier layer in HEMT devices.

An exemplary method includes providing a synaptic device including a first structure for injecting both electrons and holes into a semiconductor layer and traps for trapping both electrons and holes. An electrical signal is received at the synaptic device, thereby causing the first structure to inject one of electrons and holes into the semiconductor layer. The method further includes effecting net negative charge trapping or net positive charge trapping within the traps upon injection of the one of electrons and holes into the semiconductor layer. In some embodiments of the method, the traps comprise quantum structures in the semiconductor layer. In one or more embodiments, the first structure includes a source/drain region adjoining the semiconductor layer and containing n+ and p+ regions, the source/drain region injecting one of the electrons and holes into the semiconductor layer. The method may further include the steps of receiving a second electrical signal at the synaptic device and de-trapping the electrons or holes from the traps and/or recombining the electrons and holes in the traps in response to the second signal. In some embodiments, the first structure includes a contact region adjoining the semiconductor layer and the semiconductor layer comprises an organic layer containing the traps, the contact region injecting one of the electrons and holes into the semiconductor layer. FIG. 6D shows one exemplary structure wherein an organic layer such as a pentacene layer contains the traps. In some embodiments of the method, the synaptic device further includes a gate electrically coupled to the semiconductor layer through a gate dielectric layer. A change in gate voltage is caused upon receipt of the electrical signal, the change in gate voltage causing the injection of one of the electrons and holes by the contact region into the semiconductor layer. Some embodiments of the method, as described above with respect to FIG. 6D, further include the step of modulating the conductivity of a channel responsive to net negative charge trapping or net positive charge trapping within the traps in the semiconductor layer.

An exemplary fabrication method, such as described above with respect to FIGS. 12A-F and 13 A-D, includes obtaining a substrate including a first semiconductor layer 204, 224 and first and second electrically insulating layers, the semiconductor layer being between the first and second electrically insulating layers and removing a portion of the first semiconductor layer, thereby forming a space 208, 228 between the first and second electrically insulating layers. A channel layer 210, 230 containing quantum structures is formed in the space such that the quantum structures are functional as ambipolar traps. A source/drain structure is formed that includes p+ and n+ regions adjoining the channel layer and configured to inject both electrons and holes into the channel layer.

Those skilled in the art will appreciate that the exemplary structures discussed above can be distributed in raw form or incorporated as parts of intermediate products or end products that benefit from having synaptic devices therein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step plus function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

What is claimed is:

1. An ambipolar synaptic device comprising:
   a semiconductor layer including a channel;
   a gate operatively associated with the channel;
   a source/drain structure comprised of a highly doped region of a first doping type confined within a highly doped region of a second doping type and configured for injecting both electrons and holes into the channel of the semiconductor layer, the channel having the first doping type, and
   a dielectric or barrier layer including quantum structures or defect states configured for capturing both holes and electrons, the dielectric or barrier layer being positioned between the gate and the semiconductor layer.

2. The ambipolar synaptic device of claim 1, further including a second source/drain structure comprised of a highly doped region of the first doping type confined within a highly doped region of the second doping type.

3. An ambipolar synaptic device comprising:
   an organic semiconductor layer including a channel, the channel further including metal nanoparticles creating deep states within the channel;
   a gate operatively associated with the channel;
   a gate dielectric layer between the gate and the channel, and
   a source/drain structure configured for injecting both electrons and holes into the channel of the semiconductor layer.

4. The ambipolar synaptic device of claim 3, wherein the metal nanoparticles include a self-assembled monolayer of gold adjoining the gate dielectric layer.

5. The ambipolar synaptic device of claim 3, wherein the metal nanoparticles include gold nanoparticles randomly distributed within the channel.

6. The ambipolar synaptic device of claim 5, wherein the gold nanoparticles are randomly distributed within a plane.

7. The ambipolar synaptic device of claim 3, wherein the source/drain structure further includes a transition metal-oxide layer adjoining a surface of the channel.

8. The ambipolar synaptic device of claim 3, wherein the channel includes a top surface and a bottom surface, further including a drain adjoining the top surface of the channel.

9. The ambipolar synaptic device of claim 8, wherein the metal nanoparticles include gold nanoparticles.

10. The ambipolar synaptic device of claim 9, wherein the source/drain structure further includes a transition metal-oxide layer adjoining the bottom surface of the channel.

11. The ambipolar synaptic device of claim 9, wherein the organic semiconductor layer is a pentacene layer.

12. The ambipolar synaptic device of claim 3, wherein the channel, the gate, the gate dielectric layer and the source/drain structure are arranged as a vertical structure wherein the gate dielectric layer is above the gate, the source/drain structure is above the gate dielectric layer, and the channel is above the source/drain structure, further including a drain adjoining a top surface of the channel and a transition metal-oxide layer adjoining a bottom surface of the channel.

\* \* \* \* \*